United States Patent
Tu

(10) Patent No.: US 9,525,005 B2
(45) Date of Patent: Dec. 20, 2016

(54) IMAGE SENSOR DEVICE, CIS STRUCTURE, AND METHOD FOR FORMING THE SAME

(71) Applicant: VisEra Technologies Company Limited, Hsin-Chu (TW)

(72) Inventor: Zong-Ru Tu, Keelung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/714,803

(22) Filed: May 18, 2015

(65) Prior Publication Data

US 2016/0343765 A1  Nov. 24, 2016

(51) Int. Cl.
*H01L 27/146* (2006.01)

(52) U.S. Cl.
CPC ... *H01L 27/14643* (2013.01); *H01L 27/14627* (2013.01); *H01L 27/14629* (2013.01); *H01L 27/14685* (2013.01); *H01L 27/14689* (2013.01)

(58) Field of Classification Search
CPC ............ H01L 27/14629; H01L 27/14627; H01L 27/14685; H01L 27/14621; H01L 27/1462
See application file for complete search history.

(56) References Cited

U.S. PATENT DOCUMENTS

| | | | |
|---|---|---|---|
| 2005/0186754 A1* | 8/2005 | Kim | 438/401 |
| 2009/0256225 A1* | 10/2009 | Nakai et al. | 257/432 |
| 2010/0059842 A1* | 3/2010 | Choi | 257/432 |
| 2012/0153127 A1 | 6/2012 | Hirigoyen et al. | |
| 2012/0242873 A1* | 9/2012 | Toumiya et al. | 348/273 |
| 2012/0267739 A1* | 10/2012 | Katsuno et al. | 257/432 |
| 2012/0267744 A1* | 10/2012 | Tsuji | 257/432 |
| 2012/0267745 A1* | 10/2012 | Tsuji | 257/432 |

FOREIGN PATENT DOCUMENTS

| | | |
|---|---|---|
| JP | 2007-227643 A | 9/2007 |
| JP | 2011-61133 A | 3/2011 |
| TW | 201511244 A | 3/2015 |
| WO | 2009067439 A1 | 5/2009 |

OTHER PUBLICATIONS

Japanese Office Action dated Sep. 20, 2016, as issued in corresponding Japan Patent Application No. 2015-186748 with English translation (9 pages).

* cited by examiner

*Primary Examiner* — Kevin Parendo

(74) *Attorney, Agent, or Firm* — Muncy, Geissler, Olds & Lowe, P.C.

(57) ABSTRACT

A CIS structure is provided, including a translucent structure, a reflective structure surrounding the translucent structure, and a micro lens disposed on a side of the translucent structure. The reflective structure includes a first reflective layer surrounding the translucent structure, a second reflective layer surrounding the first reflective layer, and a third reflective layer surrounding the second reflective layer. The first, second, and third reflective layers respectively have refractive indexes N1, N2, and N3, wherein N1>N2>N3.

17 Claims, 21 Drawing Sheets

IMAGE SENSOR DEVICE, CIS STRUCTURE, AND METHOD FOR FORMING THE SAME

BACKGROUND OF THE INVENTION

Field of the Invention

The application relates in general to a CIS structure (CMOS Image Sensor), and in particular, to a CIS structure having a reflective structure.

Description of the Related Art

Conventional optoelectronic products, such as digital cameras, or mobile phones capable of capturing images, have become more and more popular, the functional demand for image sensor devices has increased accordingly. An image sensor device is used for receiving a light signal and converting the light signal into an electronic signal. After generating and processing the electronic signal, a digital image is produced. In general, image sensor devices can be categorized into two main types: one is a charge coupled device (CCD), and the other is a complementary metal oxide semiconductor (CMOS) device.

The image sensor device typically comprises a pixel array. Each pixel in the pixel array includes a photodiode that produces a signal corresponding to the intensity of light impinging. In conventional image sensor devices, a micro lens array coupled with a color filter array (translucent structure) is correspondingly disposed above the pixel array of the image sensor device. The color filter array allows the pixels to collect light with specified wavelengths.

However, despite the use of the micro lens array, a large amount of incident light may not be efficiently directed to the photodiode. As a result, the photosensitivity of the image sensor device may be reduced.

BRIEF SUMMARY OF INVENTION

To address the deficiencies of conventional image sensor devices, an embodiment of the invention provides a CIS structure, including a translucent structure, a reflective structure surrounding the translucent structure, and a micro lens disposed on a side of the translucent structure. The reflective structure includes a first reflective layer surrounding the translucent structure, a second reflective layer surrounding the first reflective layer, and a third reflective layer surrounding the second reflective layer. The first, second, and third reflective layers respectively have refractive indexes N1, N2, and N3, wherein N1>N2>N3.

An embodiment of the invention further provides an image sensor device, including a first CIS structure and a second CIS structure adjacent to the first CIS structure, wherein the first CIS structure includes a first translucent structure, a reflective structure surrounding the translucent structure, and a first micro lens disposed on the first translucent structure. The reflective structure includes a first reflective layer surrounding the translucent structure, a second reflective layer surrounding the first reflective layer, and a third reflective layer surrounding the second reflective layer. The first, second, and third reflective layers respectively have refractive indexes N1, N2, and N3, wherein N1>N2>N3. The second CIS structure includes a second translucent structure directly connected to the reflective structure and a second micro lens disposed on the second translucent structure.

An embodiment of the invention further provides a method for forming a CIS structure, including forming a first refractive layer; forming a second refractive layer, and the first refractive layer is disposed in the second refractive layer; forming a third refractive layer, and the second refractive layer is disposed in the third refractive layer; etching the third refractive layer to form a recess; forming a translucent structure in the recess; and disposing a micro lens on the translucent structure, wherein the third, second, and first refractive layers surrounds the translucent structure and respectively have refractive indexes N1, N2, and N3, and N1>N2>N3.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the CIS structure is discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1A:
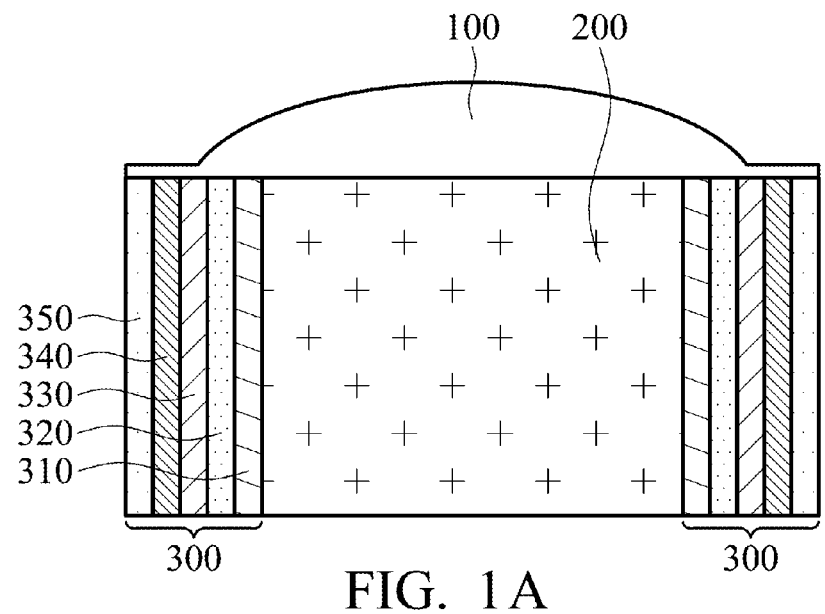
FIG. 1A is a schematic diagram of a CIS structure according to an embodiment of the invention.
Figure 1B:
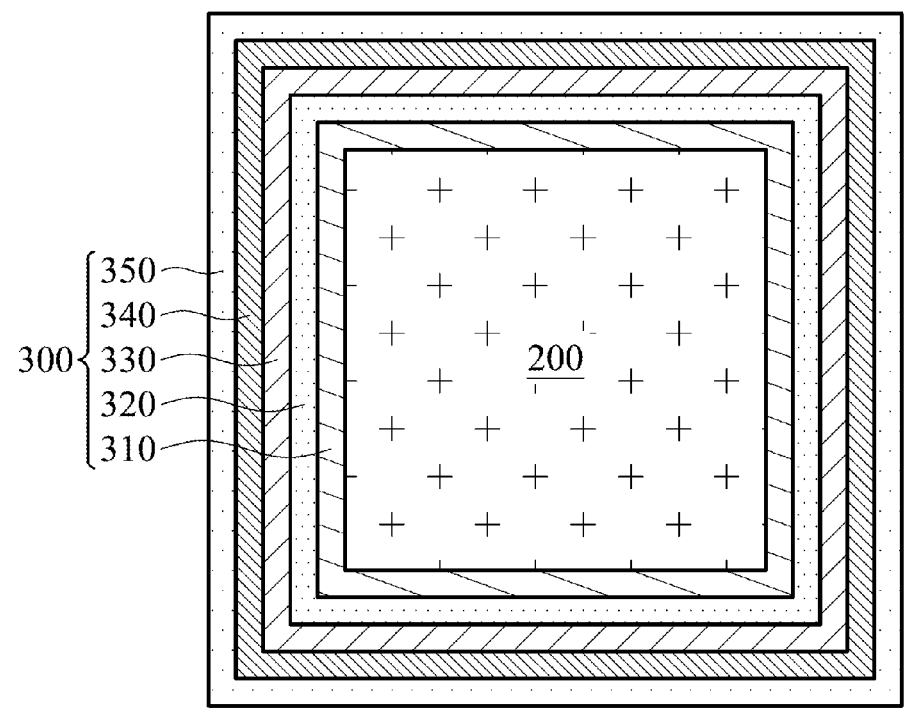
FIG. 1B is a bottom view of the CIS structure in FIG. 1.

Referring to FIGS. 1A and 1B, a CIS structure according to an embodiment of the invention primarily comprises a micro lens 100, a translucent structure 200, and a reflective structure 300. The reflective structure 300 is disposed around the translucent structure 200, and the micro lens 100 is disposed on the top side of the translucent structure 200 (FIG. 1A).

As shown in FIGS. 1A and 1B, the reflective structure 300 has five layers, including a first reflective layer 310, a second reflective layer 320, a third reflective layer 330, a first protecting layer 340, and a second protecting layer 350. In this embodiment, the first reflective layer 310 surrounds the translucent structure 200, the second reflective layer 320 surrounds the first reflective layer 310, the third reflective layer 330 surrounds the second reflective layer 320, the first protecting layer 340 surrounds the third reflective layer 330, and the second protecting layer 350 surrounds the first protecting layer 340, so as to form a concentric structure. When light enters the CIS structure through the micro lens 100 to the translucent structure 200, the first, second, and third reflective layer 310, 320, and 330 can be used to reflect and restrict light within the translucent structure 200, such that the energy received by the photodiode S can be enhanced. Moreover, the first and second protecting layers 340 and 350 can be used to prevent external light intruding into the translucent structure 200 through the reflective structure 300, such that the light cross-talk reduction can be reduced.

Specifically, the first, second, and third reflective layers 310, 320, and 330 respectively have refractive indexes N1, N2, and N3, and N1>N2>N3. In this embodiment, the refractive index of the translucent structure 200 exceeds the refractive index N1 of the first reflective layer 310. The first reflective layer 310 and the second protecting layer 350 can be formed of the same material and in the same fabrication step. Similarly, the second reflective layer 320 and the first protecting layer 340 can be formed of the same material and in the same fabrication step.

Figure 2:
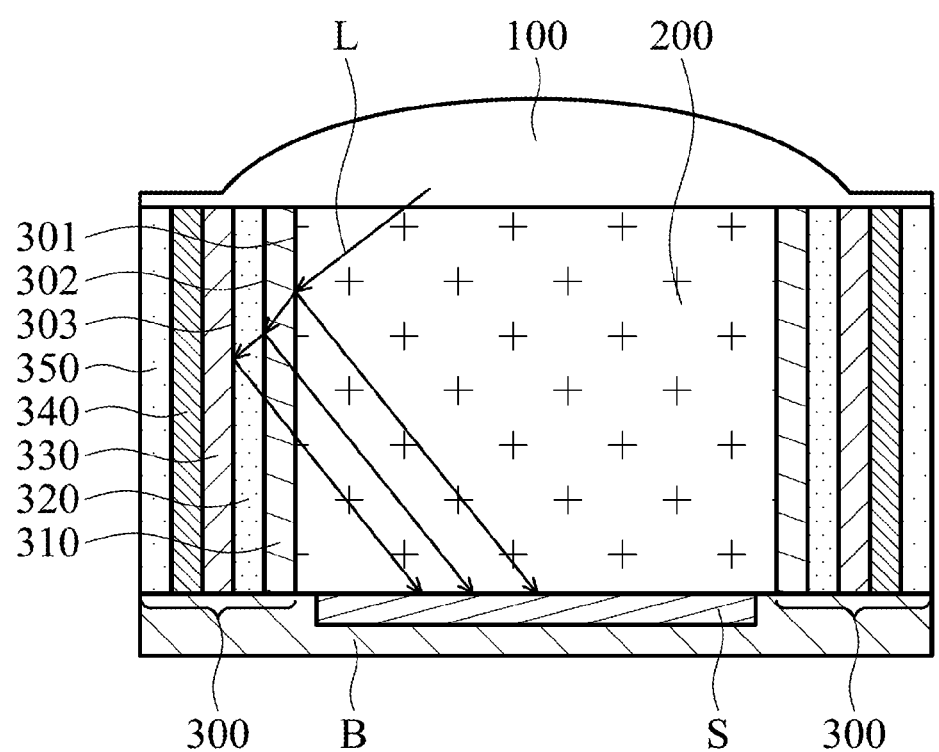
FIG. 2 is a schematic diagram illustrating how light enters the CIS structure through a micro lens and then reaches a photodiode.

As shown in FIG. 2, the CIS structure can be disposed on a substrate B with a photodiode S. When the light L enters the CIS structure through the micro lens 100, it can be reflected by the reflective structure 300 at a first grid interface 301 between the translucent structure 200 and the first reflective layer 310, a second grid interface 302 between the first and second reflective layers 310 and 320, and a third grid interface 303 between the second and third reflective layers 320 and 330. It is noted that the CIS structure having multi grid interfaces can reflect light more times than that having a single grid interface, such that the translucent structure 200 can trap more energy. Furthermore, due to the refractive index of the translucent structure 200 exceeding the refractive indexes N1, N2, and N3 of the first, second, and third reflective layers 310, 320 and 330 (N1>N2>N3), most of the light L can be reflected to the photodiode S. Therefore, the loss of light can be reduced, and high photosensitivity can be achieved.

In this embodiment, the translucent structure 200 may comprise a color filter or a clear filter. The first, second, and third reflective layers 310, 320, and 330 and the first and second protecting layer 340 and 350 may comprise polyethylene oxide (PEOX). The refractive index N1 can be 1.44-1.50 (1.46 for example), the refractive index N2 can be 1.30-1.43 (1.41 for example), and the refractive index N3 can be 1.10-1.29 (1.21 for example).

Figure 3A:
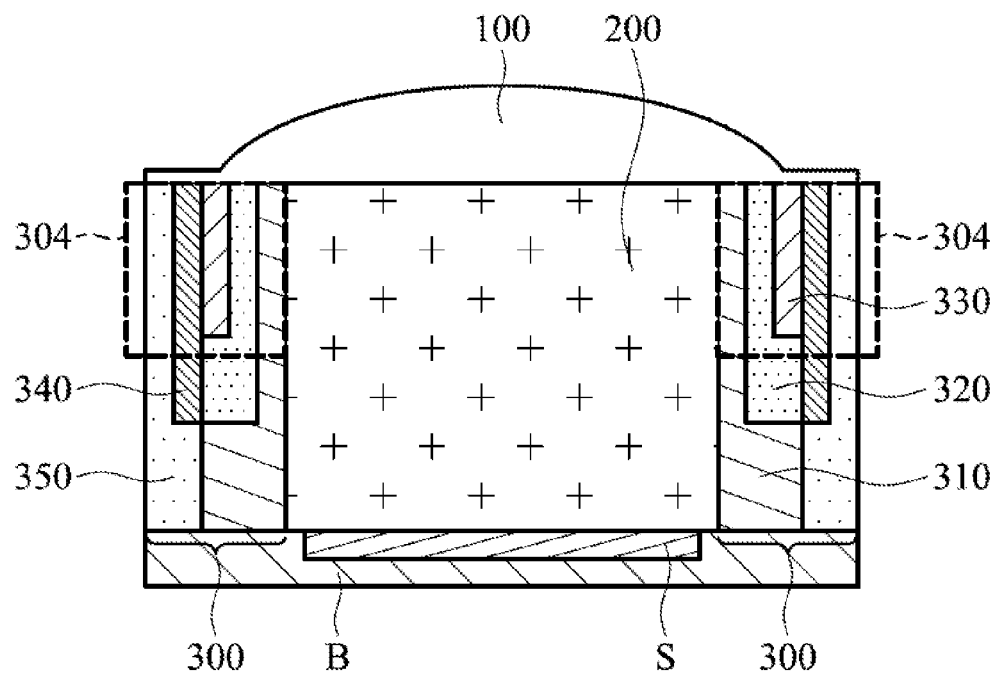
FIG. 3A is a schematic diagram of a CIS structure according to another embodiment of the invention.
Figure 3B:
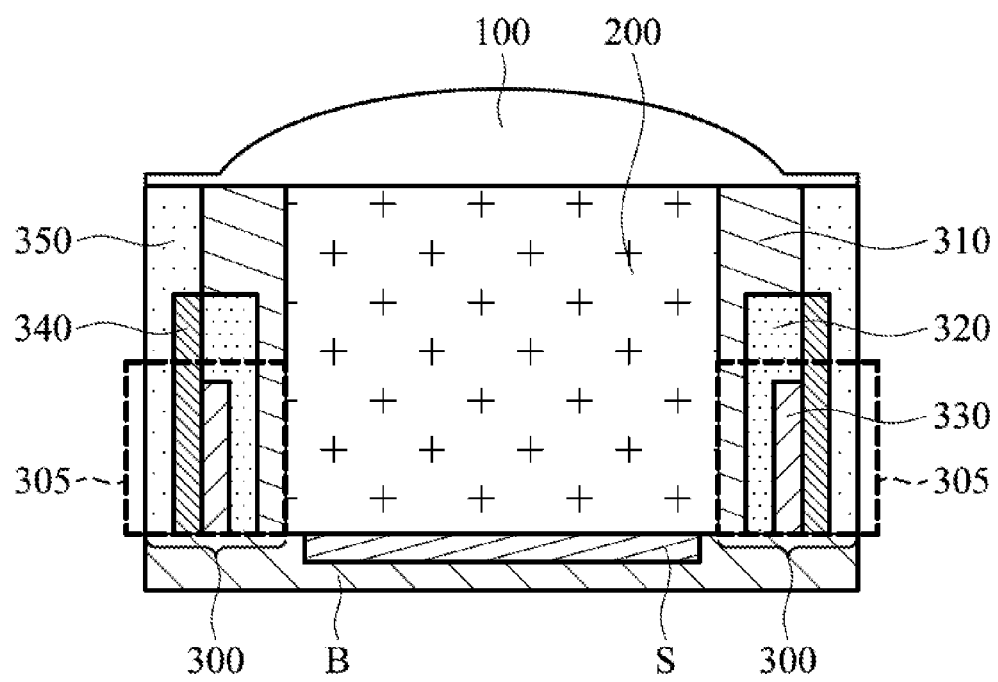
FIG. 3B is a schematic diagram of a CIS structure according to another embodiment of the invention.

Referring to FIG. 3A, in another embodiment, the third reflective layer 330 is embedded in an upper portion 304 of the reflective structure 300, and the upper portion 304 is adjacent to the micro lens 100. The first reflective layer 310 and the second protecting layer 350 have the refractive index N1, the second reflective layer 320 and the first protecting layer 340 have the refractive index N2, the third reflective layer 330 has the refractive index N3, and N1>N2>N3. Referring to FIG. 3B, in another embodiment, the third reflective layer 330 is embedded in a lower portion 305 of the reflective structure 300, and the lower portion 305 is adjacent to the substrate B. Similarly, the first reflective layer 310 and the second protecting layer 350 have the refractive index N1, the second reflective layer 320 and the first protecting layer 340 have the refractive index N2, the third reflective layer 330 has the refractive index N3, and N1>N2>N3.

The CIS structure in FIG. 2 has better effects of the light cross-talk reduction and the energy enhancement than that in FIGS. 3A and 3B, however, the CIS structures in FIGS. 3A and 3B can be formed in a simplified process and still have better effects than a conventional CIS structure. Furthermore, the location of the third reflective layer 330 can be selected according to the incident angle of the light L into translucent structure 200.

Figure 4A:
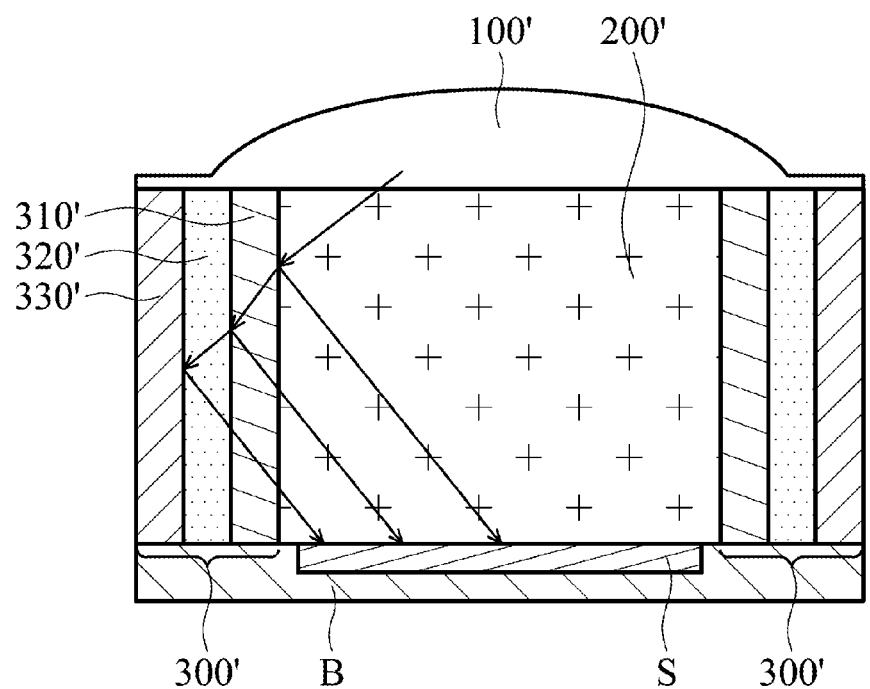
FIG. 4A is a schematic diagram of a CIS structure according to another embodiment of the invention.
Figure 4B:
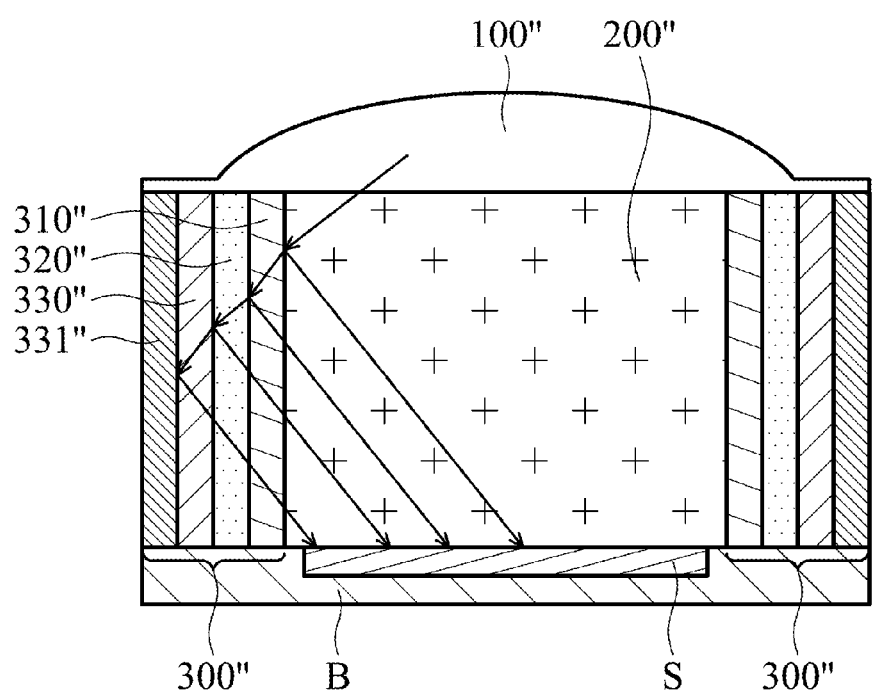
FIG. 4B is a schematic diagram of a CIS structure according to another embodiment of the invention.

The reflective structure can have three or more than three reflective layers at a horizontal direction, and reflective structure having large number of reflective layers has a better performance than that having small number of reflective layers. Referring to FIG. 4A, in another embodiment, the CIS structure has a micro lens 100', a translucent structure 200', and a reflective structure 300'. The micro lens 100' is disposed on a side of the translucent structure 200' and the reflective structure 300' surrounds the translucent structure 200'. The reflective structure 300' has three reflective layers, comprising a first reflective layer 310' surrounding a translucent structure 200', a second reflective layer 320' surrounding the first reflective layer 310', and a third reflective layer 330' surrounding the second reflective layer 320'. The first, second, and third reflective layers 310', 320', and 330' respectively have the refractive indexes N1, N2, and N3, and N1>N2>N3. As shown in FIG. 4A, the CIS structure in this embodiment can reflect the light three times. Referring to FIG. 4B, in another embodiment, the CIS structure has a micro lens 100", a translucent structure 200", and a reflective structure 300". The micro lens 100" is disposed on a side of the translucent structure 200" and the reflective structure 300" surrounds the translucent structure 200". The reflective structure 300" has four reflective layers, comprising a first reflective layer 310" surrounding a translucent structure 200", a second reflective layer 320" surrounding the first reflective layer 310", a third reflective layer 330" surrounding the second reflective layer 320", and a fourth reflective layer 331" surrounding the third reflective layer 330". The first, second, third, and fourth reflective layers 310", 320", 330", and 331" respectively have the refractive indexes N1, N2, N3, and N4, and N1>N2>N3>N4. As shown in FIG. 4B, the CIS structure in this embodiment can reflect the light four times. Because the CIS structure in FIG. 4B can reflect the light more times than that in FIG. 4A, it has a better performance.

As described in the aforementioned embodiments, the reflective structure 300 has at least three layers, and the refractive index of the layer close to the translucent structure 200 exceeds that of the layer away from the translucent structure 200.

Referring to FIGS. 5A-5H, a method for forming a CIS structure on a substrate B is provided. First, a low refractive layer 600 (first refractive layer, having a refractive index N3) is formed on the substrate B and above a photodiode S (FIG. 5A), and a first cavity 610 is then formed by etching the low refractive layer 600 (FIG. 5B), corresponding to the photodiode S. Subsequently, a middle refractive layer 700 (second refractive layer, having a refractive index N2) is formed on the substrate B and the low refractive layer 600 (FIG. 5C), and a second cavity 710 corresponding to the first cavity 610 is then formed by etching the middle refractive layer 700

Figure 5A:
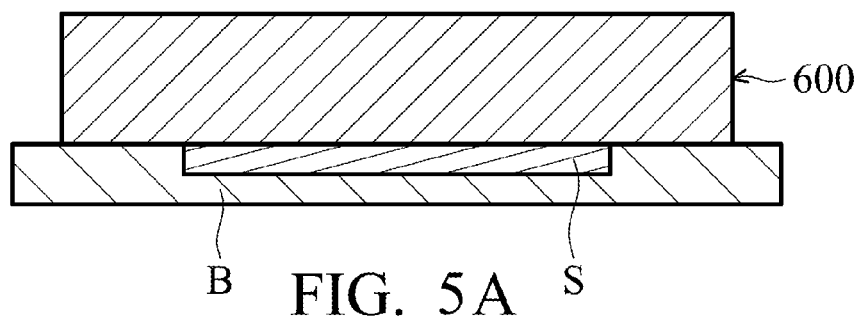
FIGS. 5A-5I are cross-sectional diagrams illustrating the steps for forming a CIS structure on a substrate according to an embodiment of the invention.
Figure 5B:
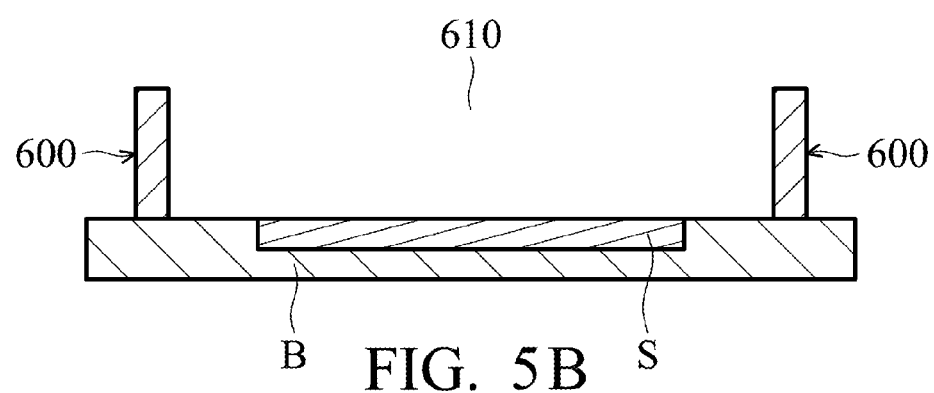
Figure 5C:
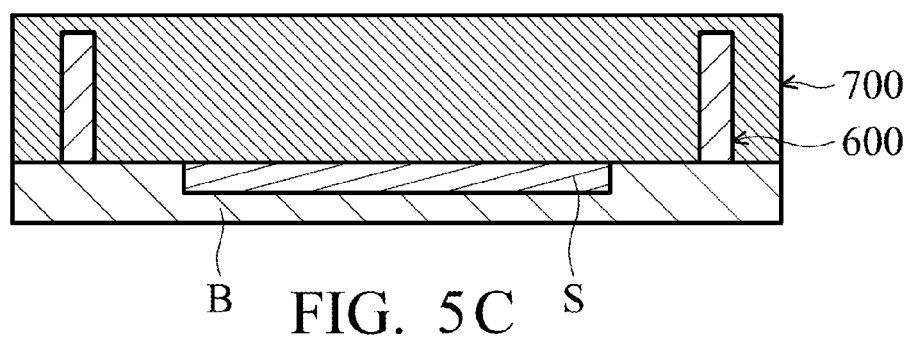
Figure 5D:
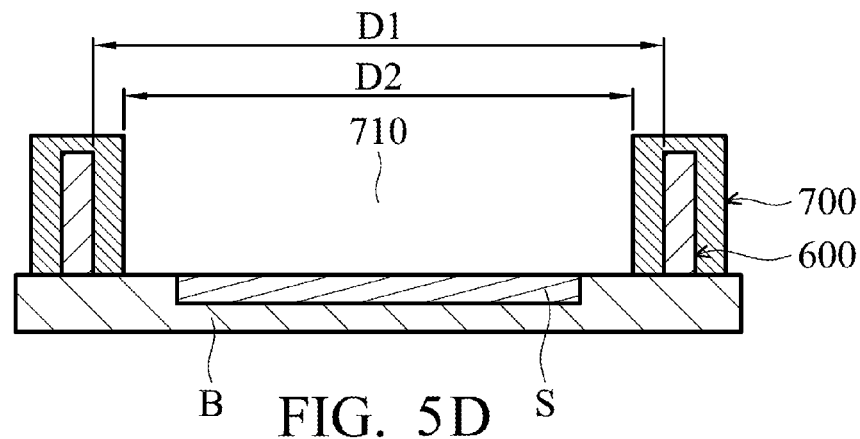
Figure 5E:
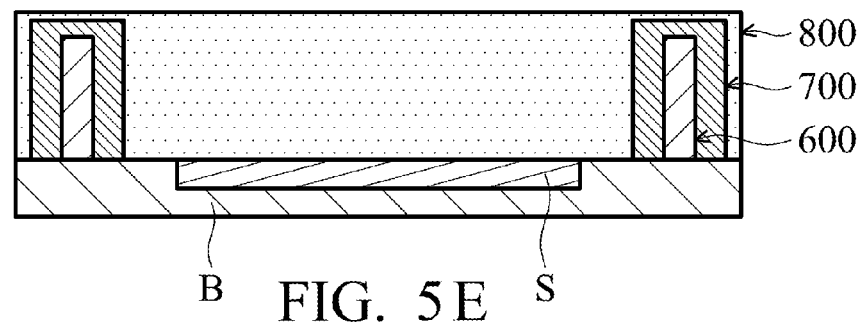

(FIG. 5D). The width D1 of the first cavity 610 exceeds the width D2 of the second cavity 710.

Figure 5F:
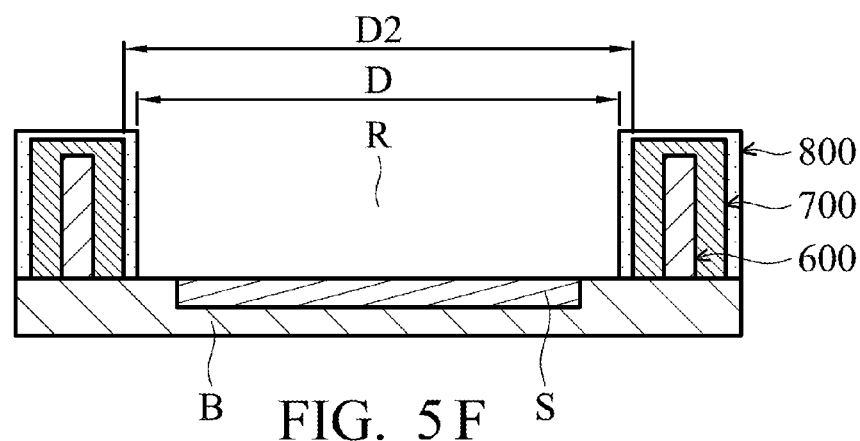
Figure 5G:
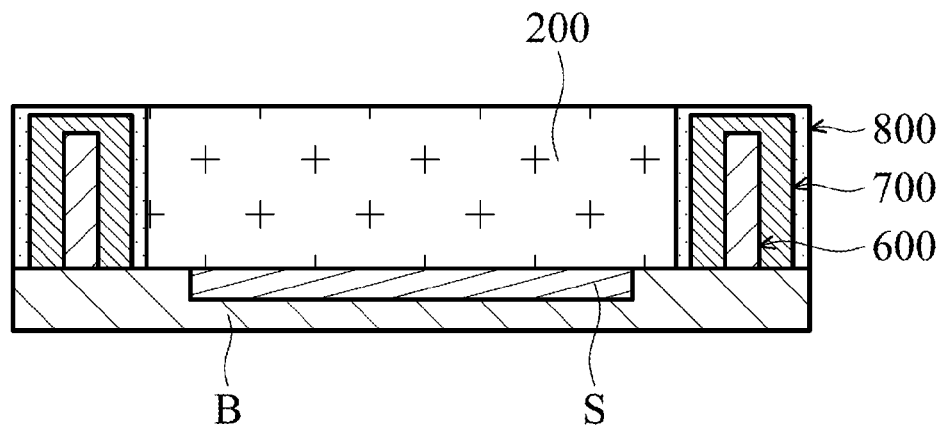
Figure 5H:
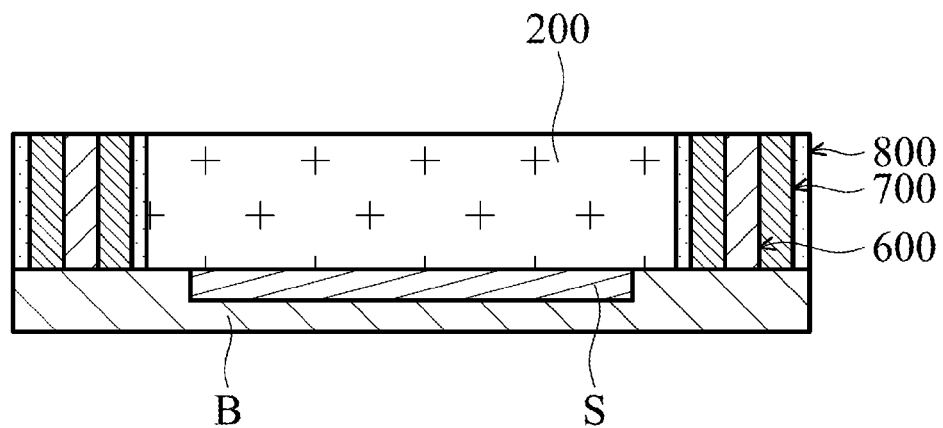
Figure 5:
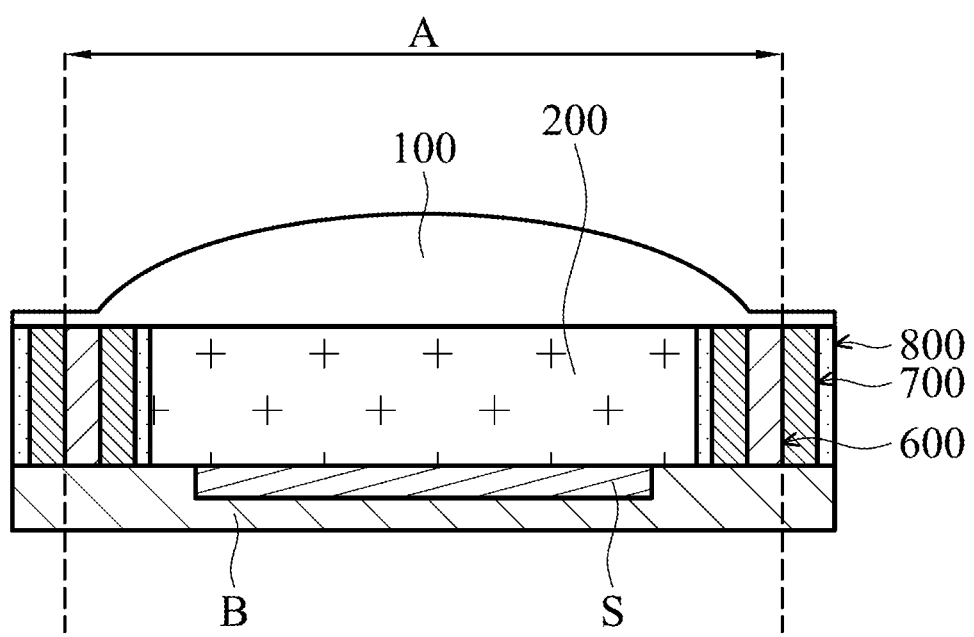

Next, a high refractive layer 800 (third refractive layer, having a refractive index N1, and N1>N2>N3) is formed on a substrate B and the middle refractive layer 700 (FIG. 5E), and a recess R corresponding to the second cavity 710 can be formed by etching the high refractive layer 800 (FIG. 5F). The width D2 of the second cavity 710 exceeds the width D of the recess R. A translucent structure 200 is then formed in the recess R (FIG. 5G), and the translucent structure 200, the high, middle, and low refractive layers 800, 700, and 600 can be trimmed (FIG. 5H) to form a concentric structure. Finally, the micro lens 100 is disposed on the translucent structure 200 (FIG. 5I). Therefore, a part of the high, middle, and low refractive layers 800, 700, and 600 within an active area A between the two dotted lines in FIG. 5I can be formed as the first, second, and third reflective layers 310, 320, and 330 shown in FIG. 1A. Additionally, an outer part of the middle and high refractive layers 700 and 800 out of the dotted lines in FIG. 5I can be formed as the first and second protecting layers 340 and 350 shown in FIG. 1A. In this embodiment, the low, middle, and high refractive layers 600, 700, 800 and the translucent structure 200 can be formed by coating or deposition.

Figure 6A:
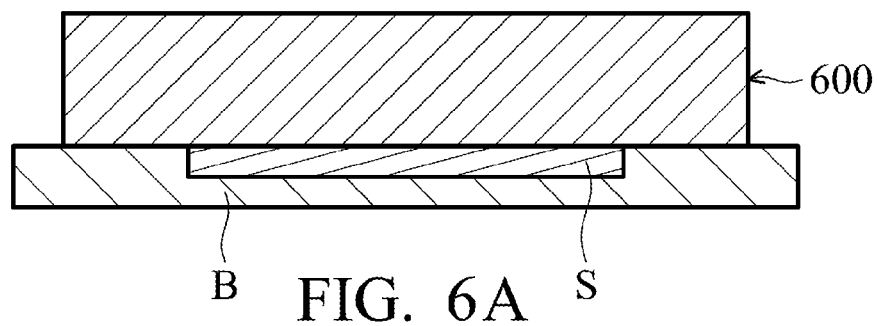
FIGS. 6A-6G are cross-sectional diagrams illustrating the steps for forming a CIS structure on a substrate according to another embodiment of the invention.
Figure 6B:
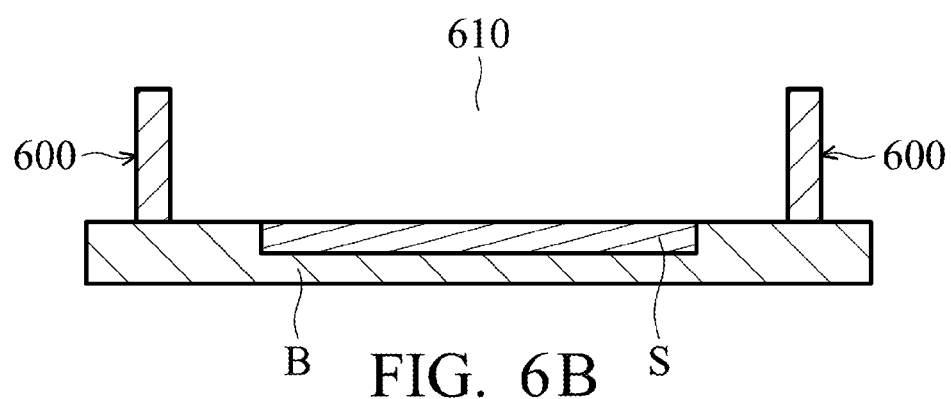
Figure 6C:
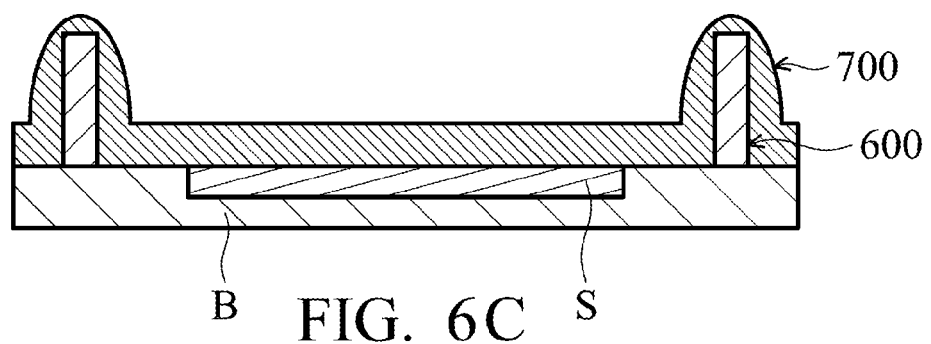
Figure 6D:
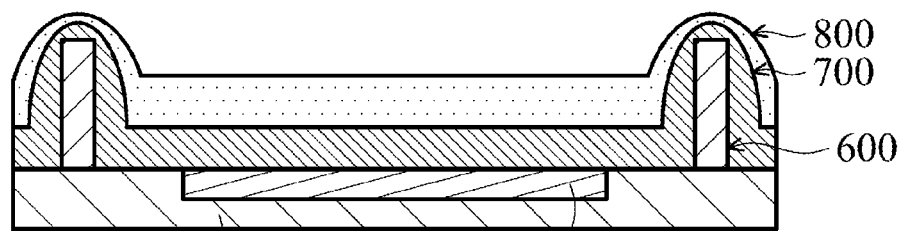

Referring to FIG. 6A-6G, another embodiment of a method for forming a CIS structure on a substrate B is also provided. Similar to the aforementioned embodiment (FIGS. 5A-5I), a low refractive layer 600 (first refractive layer, having a refractive index N3) is formed on the substrate B and above a photodiode S (FIG. 6A), and a first cavity 610 is then formed by etching the low refractive layer 600 (FIG. 6B), corresponding to the photodiode S. Subsequently, a middle refractive layer 700 (second refractive layer, having a refractive index N2) is formed on the substrate B and the low refractive layer 600 (FIG. 6C), and a high refractive layer 800 (third refractive layer, having a refractive index N1, and N1>N2>N3) is then formed on the middle refractive layer 700 (FIG. 6D).

Figure 6E:
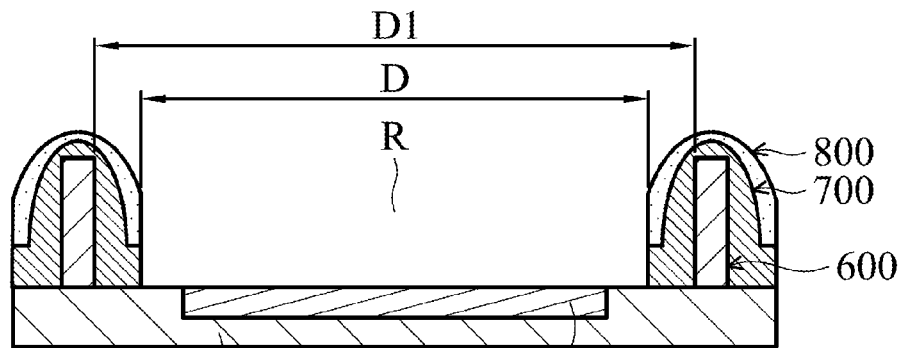
Figure 6F:
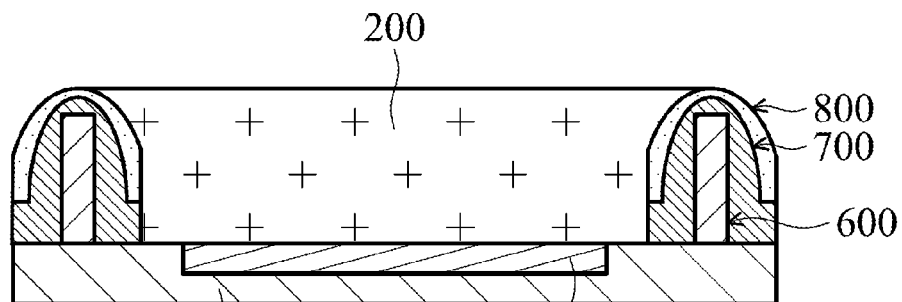
Figure 6G:
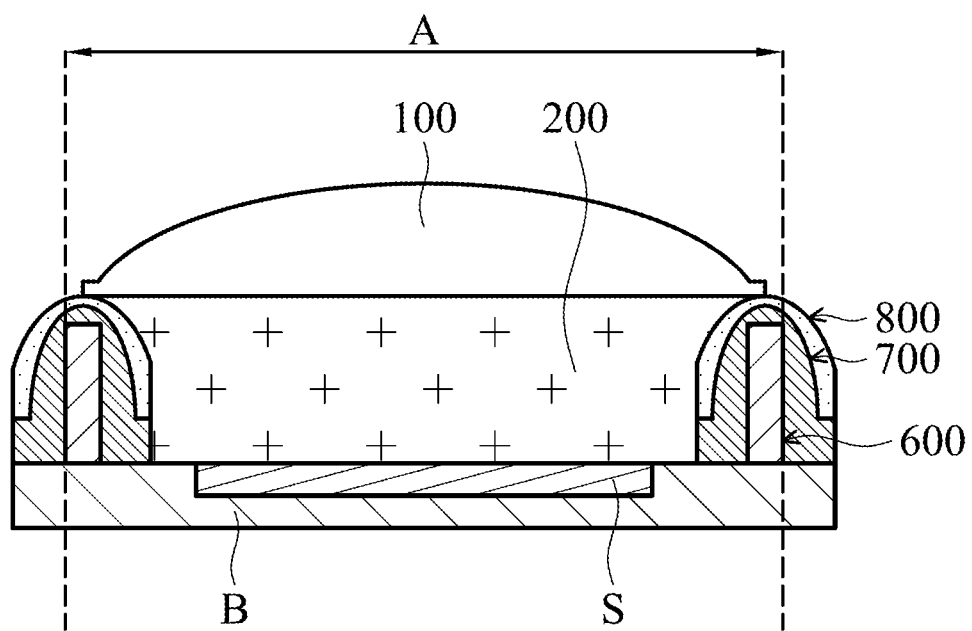

Next, a recess R corresponding to the first cavity 610 can be formed by etching the middle and high refractive layers 700 and 800, and the width D1 of the first cavity 610 exceeds the width D of the recess R (FIG. 6E). A translucent structure 200 is then formed in the recess R (FIG. 6F), and the micro lens 100 can be directly disposed on the translucent structure 200 (FIG. 6G) without trimming the high, middle, and low refractive layers 800, 700, and 600, to form the CIS structure on the substrate B. Therefore, a part of the high, middle, and low refractive layers 800, 700, and 600 within an active area A between the two dotted lines in FIG. 6G can be treated as the first, second, and third reflective layers 310, 320, and 330 shown in FIG. 1A. Additionally, an outer part of the middle and high refractive layers 700 and 800 out of the dotted lines in FIG. 6G can be treated as the first and second protecting layers 340 and 350 shown in FIG. 1A. In this embodiment, the low, middle, and high refractive layers 600, 700, 800, and the translucent structure 200 can be formed by coating or deposition.

Referring to FIG. 7A-7E, another embodiment of a method for forming a CIS structure on the substrate B is further provided. First, a high refractive layer 800 (third refractive layer, having a refractive index N1) is formed on a substrate B and above a photodiode S (FIG. 7A), and a recess R is formed by etching the high refractive layer 800 (FIG. 7B), corresponding to the photodiode S. The high refractive layer 800 comprises photosensitive material. Subsequently, a middle refractive layer 700 (second refractive layer, having a refractive index N2) and a low refractive layer 600 (first refractive layer, having a refractive index N3, and N1>N2>N3) can be formed by a light exposure process (FIG. 7C), and theirs refraction indexes can be controlled by the exposure energy.

Figure 7A:
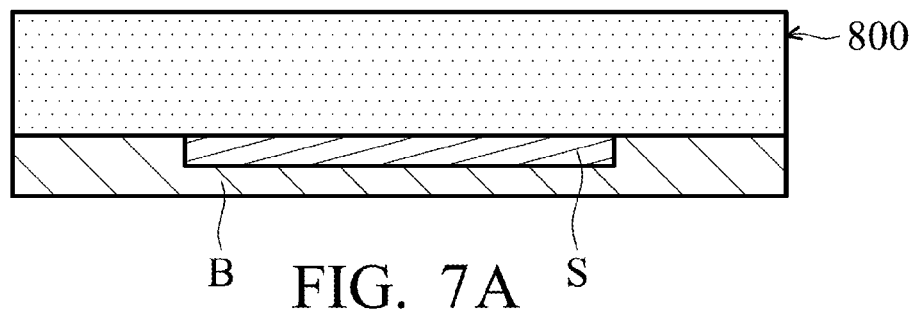
FIGS. 7A-7E are cross-sectional diagrams illustrating the steps for forming a CIS structure on a substrate according to another embodiment of the invention.
Figure 7B:
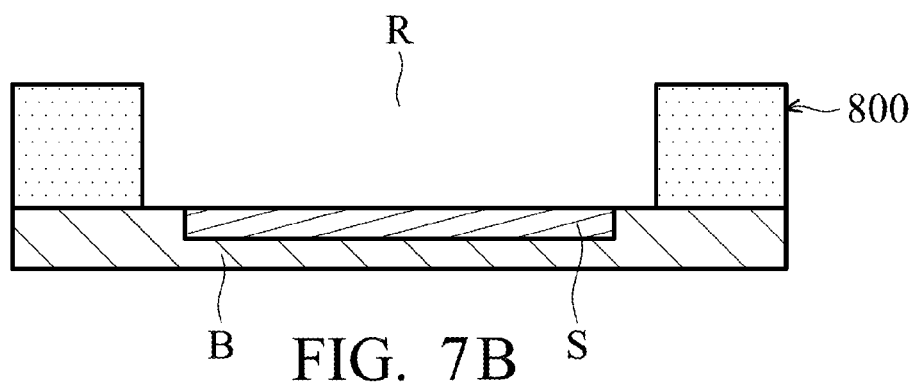
Figure 7C:
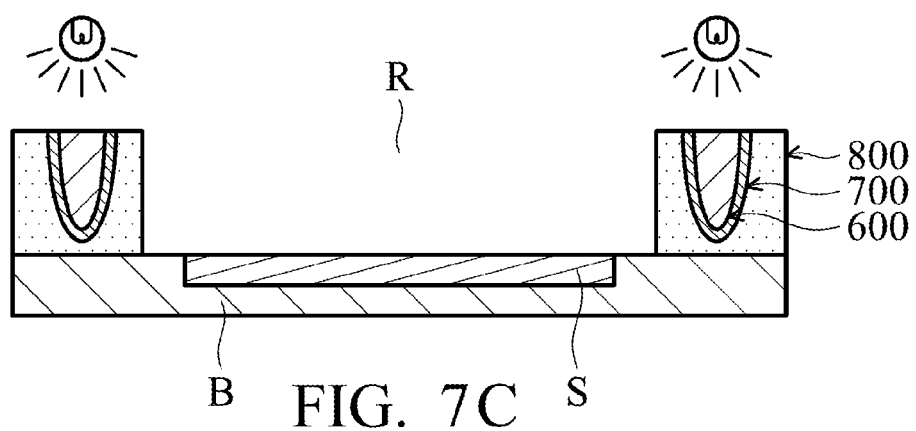
Figure 7D:
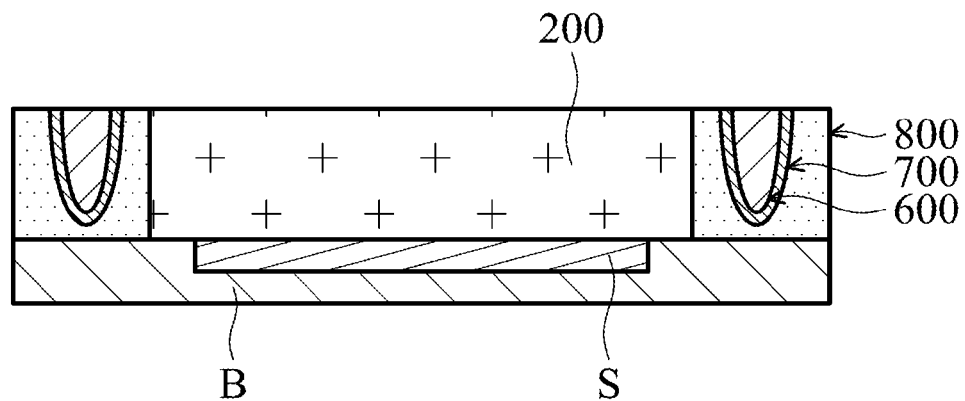
Figure 7E:
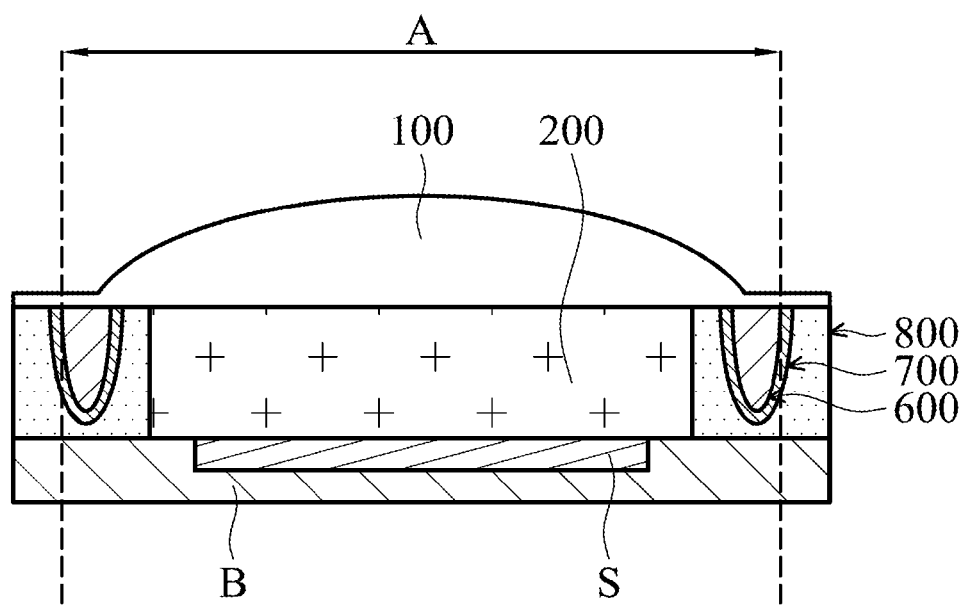

A translucent structure 200 is then formed in the recess R (FIG. 7D), and the micro lens 100 is disposed on the translucent structure 200 (FIG. 7E). Therefore, a part of the high, middle, and low refractive layers 800, 700, and 600 within an active area A between the two dotted lines in FIG. 7E can be applied as the first, second, and third reflective layers 310, 320, and 330 shown in FIG. 1A. Additionally, an outer part of the middle and high refractive layers 700 and 800 out of the dotted lines in FIG. 7E can be applied as the first and second protecting layers 340 and 350 shown in FIG. 1A. In this embodiment, the high refractive layer 800 and translucent structure 200 can be formed by coating or deposition.

Figure 8A:
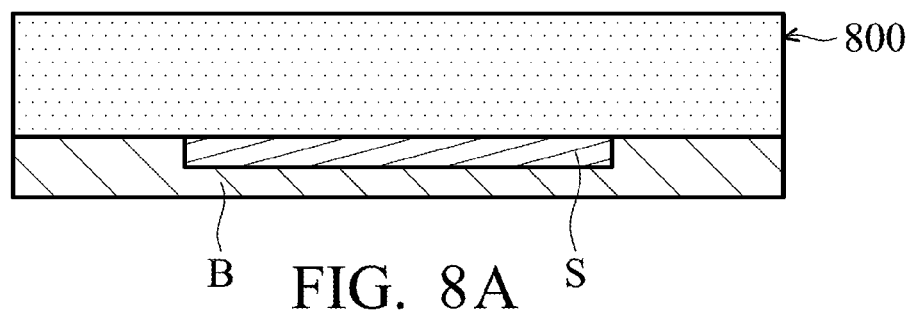
FIGS. 8A-8G are cross-sectional diagrams illustrating the steps for forming a CIS structure on a substrate according to another embodiment of the invention.
Figure 8B:
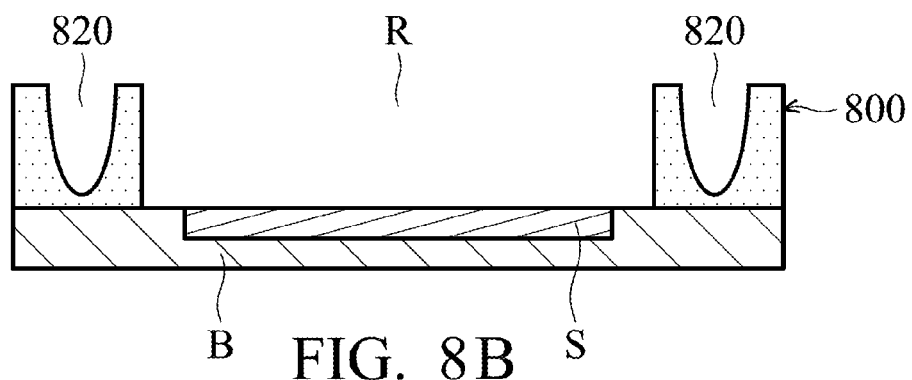
Figure 8C:
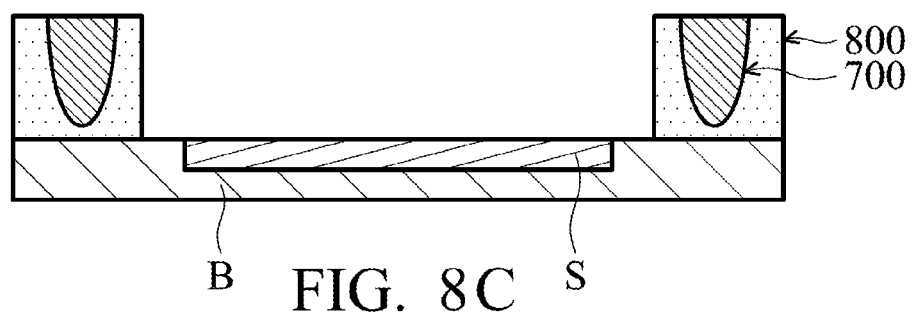
Figure 8D:
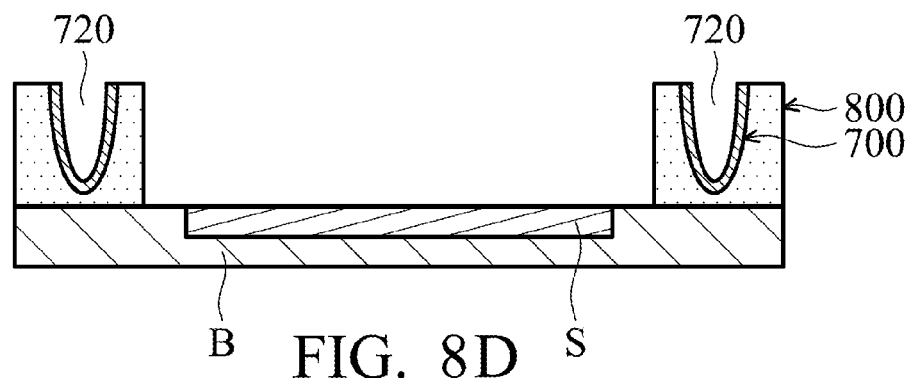

Referring to FIG. 8A-8G, another embodiment of a method for forming a CIS structure on a substrate B is also provided. First, a high refractive layer 800 (third refractive layer, having a refractive index N1) is formed on the substrate B and above a photodiode S (FIG. 8A), and a recess R and a first groove 820 are formed by etching the high refractive layer 800 (FIG. 8B). The first groove 820 surrounds the recess R. Subsequently, a middle refractive layer 700 (second refractive layer, having a refractive index N2) is formed in the first groove 820 (FIG. 8C), and a second groove 720 surrounding the recess R is formed by etching the middle refractive layer 700 (FIG. 8D).

Figure 8E:
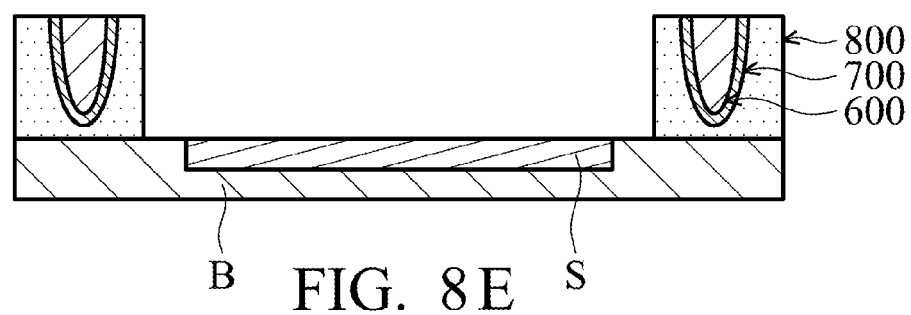
Figure 8F:
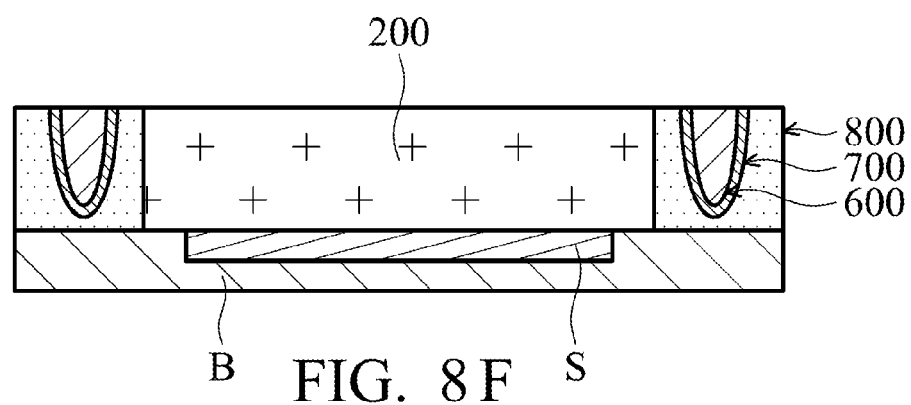
Figure 8G:
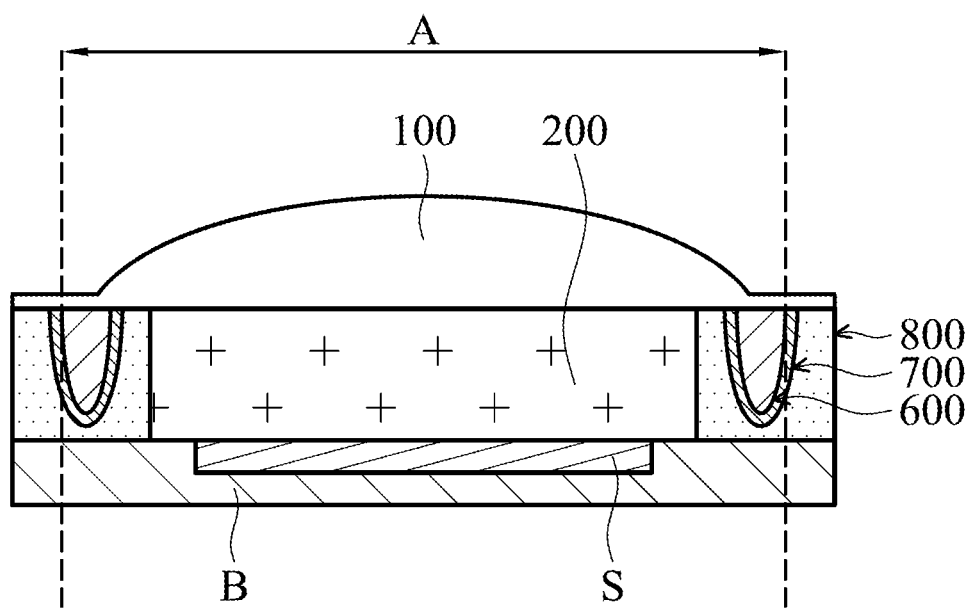

Next, a low refractive layer 600 (first refractive layer, having a refractive index N3, and N1>N2>N3) is formed in the second groove 720 (FIG. 8E). A translucent structure 200 is then formed in the recess R (FIG. 8F), and the micro lens 100 is disposed on the translucent structure 200 (FIG. 8G) to form the CIS structure. Therefore, a part of the high, middle, and low refractive layers 800, 700, and 600 within an active area A between the two dotted lines in FIG. 8G can be used as the first, second, and third reflective layers 310, 320, and 330 shown in FIG. 1A. Additionally, an outer part of the middle and high refractive layers 700 and 800 out of the dotted lines in FIG. 8G can be used as the first and second protecting layers 340 and 350 shown in FIG. 1A. In this embodiment, the low, middle, and high refractive layers 600, 700, and 800 and translucent structure 200 can be formed by coating or deposition.

Figure 9:
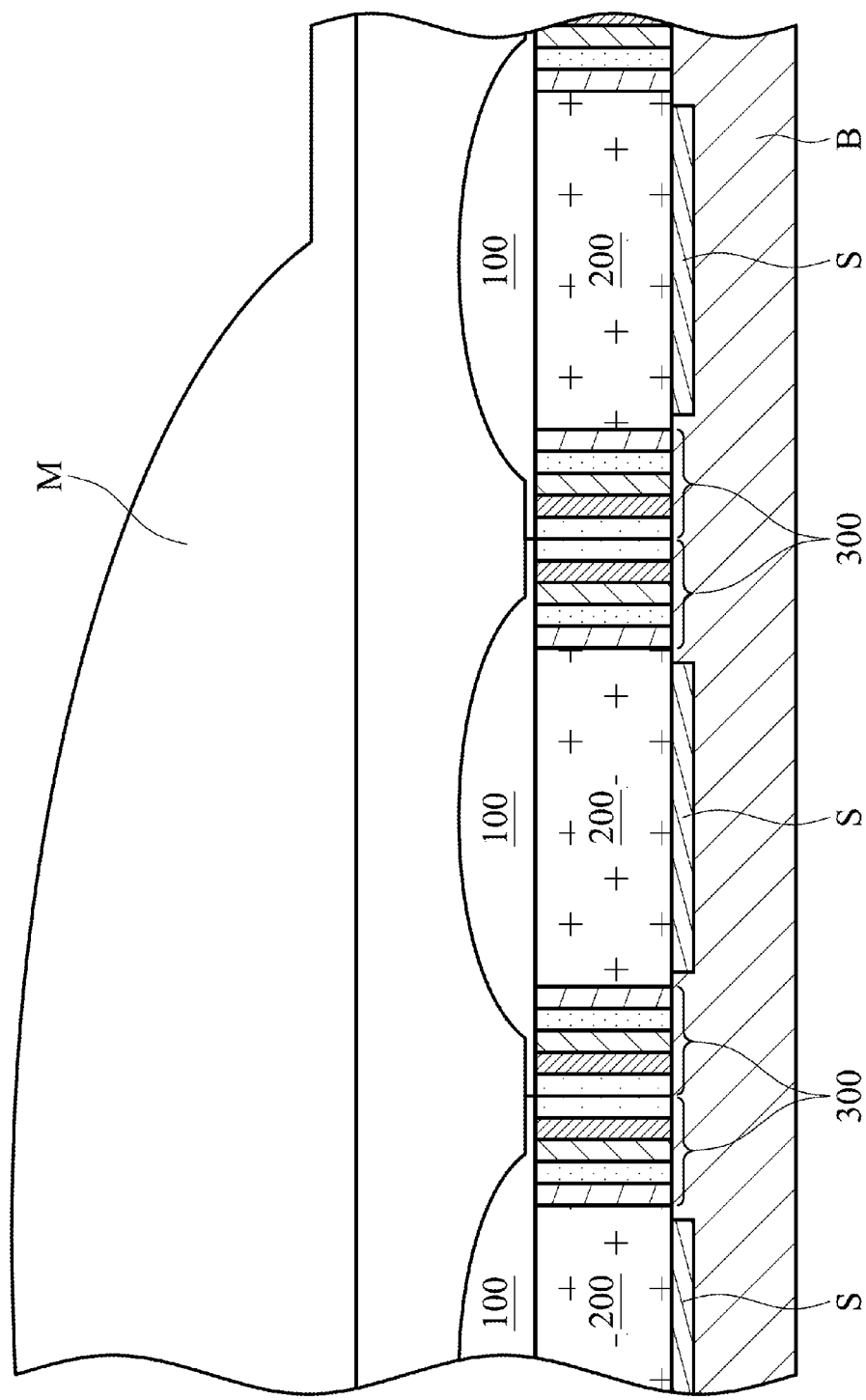
FIG. 9 is a partial schematic diagram of an image sensor device according to an embodiment of the invention.

FIG. 9 is a partial schematic diagram of an image sensor device according to an embodiment of the invention, and a plurality of CIS structures shown in FIGS. 1A and 1B are arranged in matrix between a main lens M and a substrate B with a plurality of photodiodes S. It should be noted that, in some embodiments, the CIS structures in FIGS. 3A, 3B, 4, 6G, 7E, and 8G can also be applied in the image sensor device.

Figure 10A:
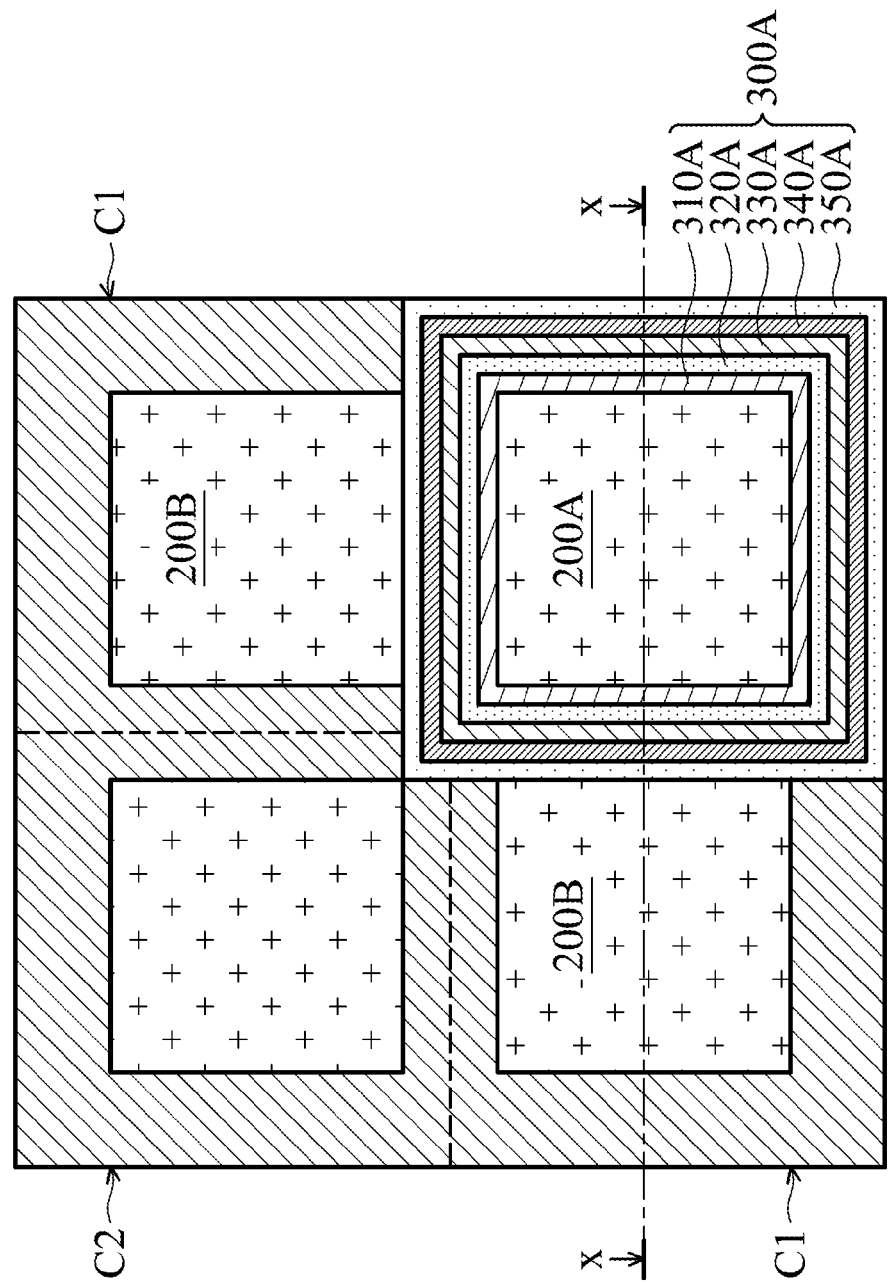
FIGS. 10A and 10B are schematic diagrams illustrating a CIS structure disposed on a chosen photodiode according to an embodiment of the invention.
Figure 10B:
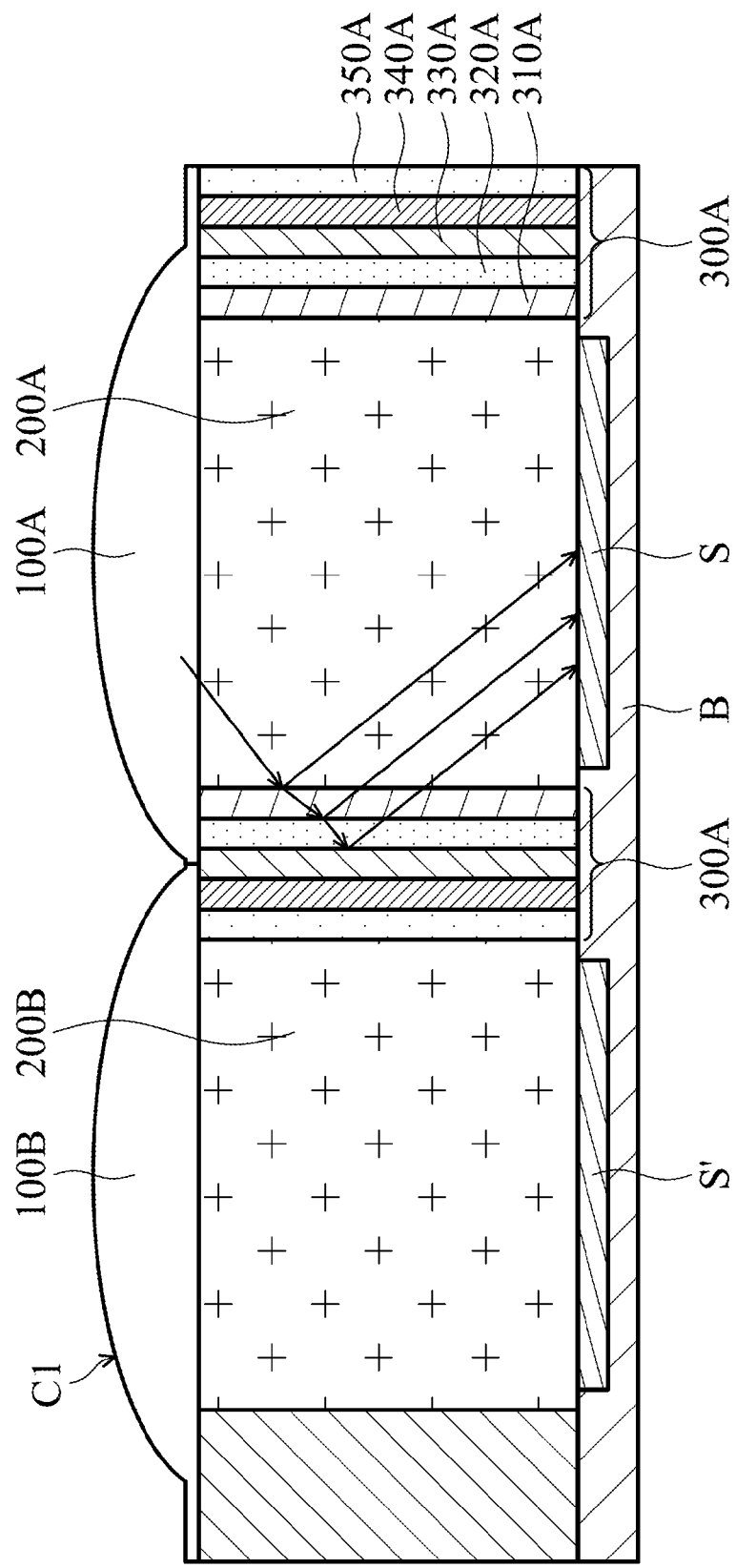

The aforementioned CIS structures can be disposed on one pixel, some pixels for receiving special color light, or the entire pixel array of the image sensor device, so as to improve sensitivity of the specific pixels. As shown in FIGS. 10A and 10B, in this embodiment, a first CIS structure (the same as the CIS structure in FIG. 2) having a first micro lens 100A, a first translucent structure 200A, and a reflective structure 300A is disposed on a specific pixel having a chosen photodiode S, CIS structures C1 having a second micro lens 100B and a second translucent structure 200B are disposed on pixels having photodiodes S', and a conventional CIS structure C2 is disposed on a pixel having another photodiode (not shown). The reflective structure 300A comprises the first, second, and third reflective layers 310A, 320A, and 330A, and the first and second protecting layers 340A and 350A. The first reflective layer 310A and the second protecting layer 350A have the refractive index N1, the second reflective layer 320A and the first protecting layer 340A have the refractive index N2, the third reflective layer 330A has the refractive index N3, and N1>N2>N3. Therefore, the light enters the first translucent structure 200A can be multi-reflected to the chosen photodiode S, and the sensitivity of the specific pixel can be improved.

As shown in FIG. 10B, because the second translucent structure 200B of the second CIS structure C1 is directly connected to the reflective structure 300A of the first CIS structure, the light enters the second translucent structure 200B can also be multi-reflected to the photodiode S at right side. On the contrary, the light enters the second translucent structure 200B is reflected once at other sides (such as the left side of the second CIS structure C1 in FIG. 10B). Furthermore, as shown in FIG. 10A, since the conventional CIS structure C2 is not attached to the first CIS structure, the photodiode corresponding to the conventional structure C2 is surrounded by a single layer, and the light enters the conventional CIS structure C2 can merely reflected once. Therefore, the amount of light reflected to the photodiodes can be adjusted by disposing the different CIS structures on the different photodiodes.

Figure 11A:
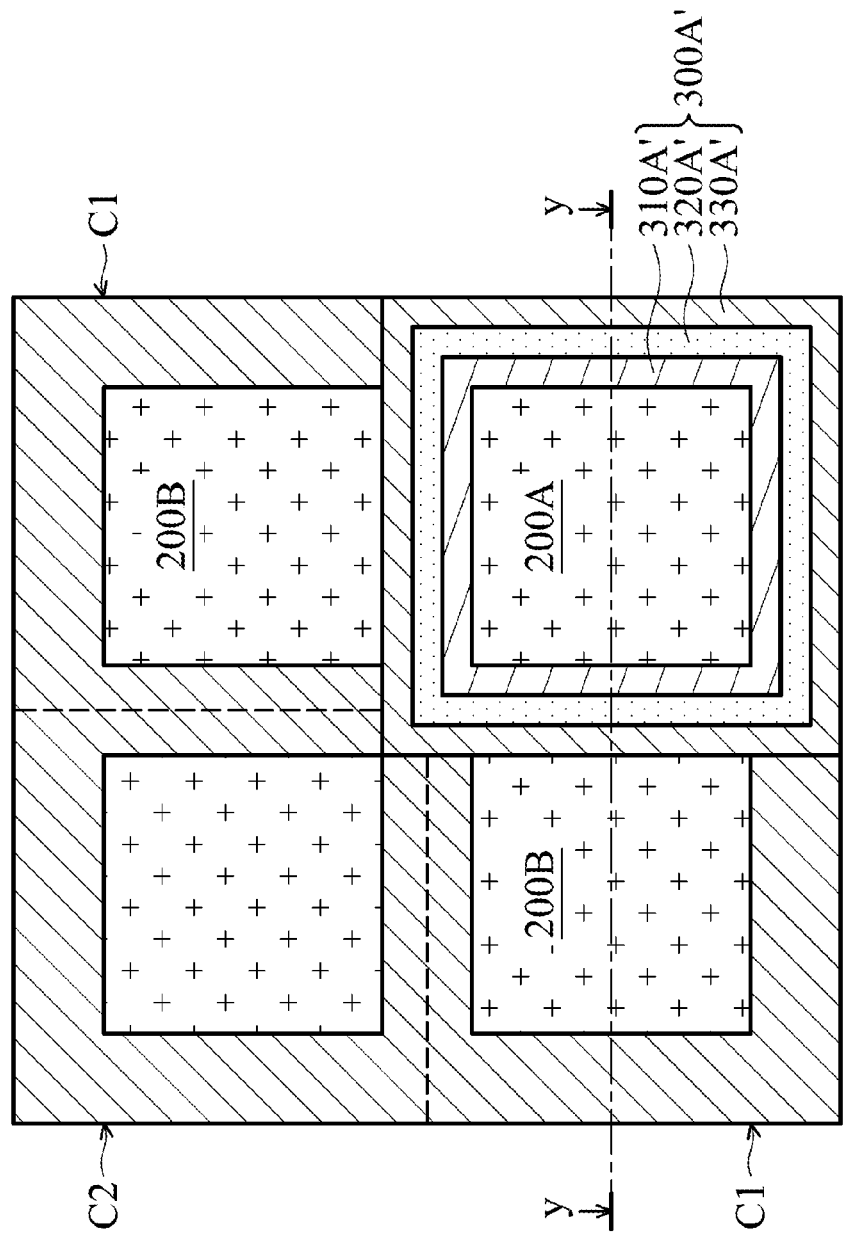
FIGS. 11A and 11B are schematic diagrams illustrating a CIS structure disposed on a chosen photodiode according to another embodiment of the invention.
Figure 11B:
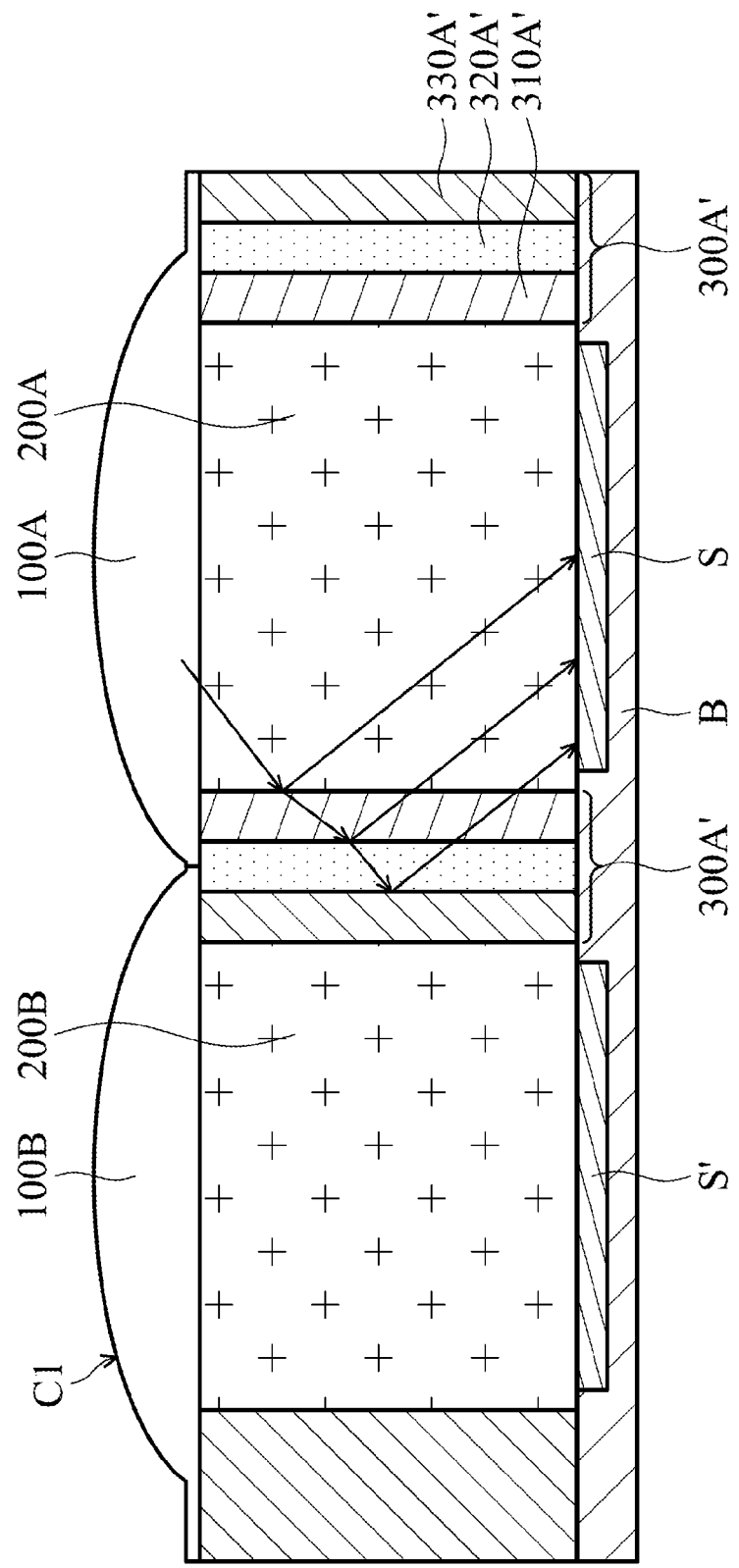

FIGS. 11A and 11B illustrate an image sensor device according to another embodiment. The reflective structure 300A' only has three layers, comprising a first reflective layer 310A' having a refractive index N1, a second reflective layer 320A' having a refractive index N2, and a third reflective layer having a refractive index N3, and N1>N2>N3. Although the reflective structure 300A in FIGS. 10A and 10B has more layers than the reflective structure 300A' in FIGS. 11A and 11B, the function of improving the sensitivity of the specific pixel can be achieved in both image sensor devices.

In summary, an image sensor device and a CIS structure thereof are provided in the invention. With the multi-layer reflective structure with different refractive indexes, when the light enters the optical module through the micro lens, it can be reflected and guided to the photodiode, such that high photosensitivity of the image sensor device can be achieved.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A CIS structure, comprising:
   a translucent structure;
   a reflective structure surrounding the translucent structure, comprising:
     a first reflective layer, surrounding the translucent structure and having a refractive index N1;
     a second reflective layer, surrounding the first reflective layer and having a refractive index N2;
     a third reflective layer, surrounding the second reflective layer and having a refractive index N3, wherein N1>N2>N3;
     a first protecting layer, surrounding the third reflective layer, wherein the first protecting layer and the second reflective layer are formed of the same material; and
     a second protecting layer, surrounding the third reflective layer, wherein the second protecting layer and the first reflective layer are formed of the same material; and
   a micro lens, disposed on a side of the translucent structure.

2. The CIS structure as claimed in claim 1, wherein a refractive index of the translucent structure exceeds the refractive index N1 of the first reflective layer.

3. The CIS structure as claimed in claim 1, wherein the second protecting layer surrounds the first protecting layer.

4. The CIS structure as claimed in claim 1, wherein the refractive index N1 of the first reflective layer is 1.44-1.50.

5. The CIS structure as claimed in claim 1, wherein the refractive index N2 of the second reflective layer is 1.30-1.43.

6. The CIS structure as claimed in claim 1, wherein the refractive index N3 of the third reflective layer is 1.10-1.29.

7. The CIS structure as claimed in claim 1, wherein the third reflective layer is embedded in an upper portion of the reflective structure, wherein the upper portion is adjacent to the micro lens.

8. The CIS structure as claimed in claim 1, wherein the third reflective layer is embedded in a lower portion of the reflective structure, wherein the lower portion is adjacent to the substrate.

9. The CIS structure as claimed in claim 1, wherein the translucent structure passes through the reflective structure.

10. An image sensor device, comprising:
    a first CIS structure, comprising:
      a first translucent structure;
      a reflective structure surrounding the first translucent structure, comprising:
        a first reflective layer, surrounding the first translucent structure and having a refractive index N1;
        a second reflective layer, surrounding the first reflective layer and having a refractive index N2;
        a third reflective layer, surrounding the second reflective layer and having a refractive index N3, wherein N1>N2>N3;
        a first protecting layer, surrounding the third reflective layer, wherein the first protecting layer and the second reflective layer have the same refractive index N2; and
        a second protecting layer, surrounding the third reflective layer, wherein the second protecting layer and the first reflective layer have the same refractive index N1; and
      a first micro lens, disposed on the first translucent structure; and
    a second CIS structure, adjacent to the first CIS structure, and the second CIS structure comprising:
      a second translucent structure, directly connected to the reflective structure; and
      a second micro lens, disposed on the second translucent structure.

11. The image sensor device as claimed in claim 10, wherein the second translucent structure is attached to the second protecting layer.

12. The image sensor device as claimed in claim 10, wherein the second translucent structure is attached to the third reflective layer.

13. The image sensor device as claimed in claim 10, wherein the first translucent structure passes through the reflective structure.

14. A method for forming a CIS structure, comprising:
    forming a first reflective layer;

forming a second reflective layer on the first reflective layer, the second reflective layer surrounding the first reflective layer;

forming a third reflective layer on the second reflective layer, the third reflective layer surrounding the second reflective layer;

forming a first protecting layer, the first protecting layer surrounding the third reflective layer, wherein the first protecting layer and the second reflective layer are formed of the same material;

forming a second protecting layer, the second protecting layer surrounding the third reflective layer, wherein the second protecting layer and the first reflective layer are formed of the same material;

etching the third reflective layer to form a recess;

forming a translucent structure in the recess; and disposing a micro lens on the translucent structure, wherein the first, second, and third reflective layers surround the translucent structure and respectively have refractive indexes N1, N2, and N3, and N1>N2>N3.

15. The method as claimed in claim 14, wherein the first reflective layer, the second reflective layer, the third reflective layer, and the translucent structure are formed by coating or deposition.

16. The method as claimed in claim 14, further comprising:

etching the first reflective layer to form a first cavity, wherein a portion of the second reflective layer is formed in the first cavity.

17. The method as claimed in claim 16, further comprising:

etching the second reflective layer to form a second cavity, wherein a portion of the third reflective layer is formed in the second cavity; and trimming the translucent structure, the first reflective layer, the second reflective layer, and the third reflective layer.

* * * * *